United States Patent
Zhang et al.

(10) Patent No.: US 7,800,141 B2
(45) Date of Patent: Sep. 21, 2010

(54) ELECTRONIC DEVICE INCLUDING A SEMICONDUCTOR FIN

(75) Inventors: Da Zhang, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/174,357

(22) Filed: Jul. 16, 2008

(65) Prior Publication Data

US 2008/0296620 A1 Dec. 4, 2008

Related U.S. Application Data

(62) Division of application No. 11/375,894, filed on Mar. 15, 2006, now Pat. No. 7,413,970.

(51) Int. Cl.
*H01L 29/06* (2006.01)
(52) U.S. Cl. .............. 257/213; 257/E21.014; 257/18
(58) Field of Classification Search .......... 257/213
See application file for complete search history.

(56) References Cited

U.S. PATENT DOCUMENTS

| 7,015,107 B2 | 3/2006 | Sugihara et al. |
| 7,115,945 B2 | 10/2006 | Lee et al. |
| 2005/0272190 A1 | 12/2005 | Lee et al. |
| 2006/0113522 A1* | 6/2006 | Lee et al. ............ 257/18 |

OTHER PUBLICATIONS

Collaert et al., "Tall Triple-Gate Devices with TiN/HfO2 Gate Stack," 2005 Symposium on VLSI Technology Digest of Technical Papers, pp. 108-109.
Ghani et al., "A 90nm High Volume Manufacturing Logic Technology Featuring Novel 45nm Gate Length Strained Silicon CMOS Transistors," 2003 IEEE, 3 pages.

* cited by examiner

*Primary Examiner*—Brook Kebede
*Assistant Examiner*—Tony Tran (57) ABSTRACT

An electronic device can include a semiconductor fin overlying an insulating layer. The electronic device can also include a semiconductor layer overlying the semiconductor fin. The semiconductor layer can have a first portion and a second portion that are spaced-apart from each other. In one aspect, the electronic device can include a conductive member that lies between and spaced-apart from the first and second portions of the semiconductor layer. The electronic device can also include a metal-semiconductor layer overlying the semiconductor layer. In another aspect, the semiconductor layer can abut the semiconductor fin and include a dopant. In a further aspect, a process of forming the electronic device can include reacting a metal-containing layer and a semiconductor layer to form a metal-semiconductor layer. In another aspect, a process can include forming a semiconductor layer, including a dopant, abutting a wall surface of a semiconductor fin.

20 Claims, 5 Drawing Sheets

ELECTRONIC DEVICE INCLUDING A SEMICONDUCTOR FIN

CROSS-REFERENCE TO RELATED APPLICATION

The present application is a divisional application of and claims priority under 35 U.S.C. §120 to U.S. patent application Ser. No. 11/375,894, entitled "Process of Forming an Electronic Device Including a Semiconductor Fin," filed on Mar. 15, 2006, which is hereby incorporated by reference herein in its entirety.

BACKGROUND

1. Field of the Disclosure

The present disclosure relates to electronic devices, more particularly, to electronic devices including a semiconductor fin overlying an insulating layer.

2. Description of the Related Art

Lowering the resistivity of electrical pathways can improve the performance of electrical devices. One method for achieving this is to form a metal-semiconductor layer along conductive features of the pathway. Reacting a metal-containing layer with a portion of a semiconductor layer can form a metal-semiconductor layer. Examples of metal-semiconductor materials can include NiSi, WSi, TiSi, CoSi, ErSi, PtSi, NiSiPt or any combination thereof. Such a reaction can consume a portion of the semiconductor layer. While the process can lower the electrical resistivity of a subsequently formed electrical pathway, the consumption of semiconductor material can make the process difficult to use in manufacturing electrical device with small features. The consumption of semiconductor material can be particularly problematic when the small features are designed to have semiconductor properties.

The structure of the metal material in the metal-containing layer, the semiconductor material in the semiconductor layer, the metal-semiconductor material in the metal-semiconductor layer, or any combination thereof can each be different from the other. The structural difference can result in an interface between the resulting layers with a roughness average ("Ra") value greater than 4 nm. The roughness of the interface can cause problems with the electronic device such as a spike shorting the source/drain region to the channel region.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include an insulating layer, and a semiconductor fin overlying the insulating layer. In one aspect, the electronic device can include a semiconductor layer overlying the semiconductor fin. The semiconductor layer can have a first portion and a second portion that are spaced-apart from each other. The electronic device can further include a conductive member lying between and spaced-apart from the first portion of the semiconductor layer and the second portion of the semiconductor layer, and overlying and spaced-apart from the semiconductor fin. The electronic device can also include a metal-semiconductor layer overlying the semiconductor layer.

In another aspect, the electronic device can include a semiconductor layer abutting the semiconductor fin. The semiconductor layer can include a dopant. The semiconductor layer can also include a first portion and a second portion that are spaced-apart from each other. The electronic device can further include a conductive member lying between and spaced-apart from the first portion of the semiconductor layer and the second portion of the semiconductor layer, and overlying and spaced-apart from the semiconductor fin.

In still another aspect, a process of forming an electronic device can include forming a semiconductor fin over an insulating layer, wherein the semiconductor fin includes a wall surface and has a first germanium content. The process can also include forming a semiconductor layer abutting the wall surface of the semiconductor fin, wherein the semiconductor layer includes a dopant and has a second germanium content higher than the first germanium content, and wherein the dopant is an n-type dopant or a p-type dopant. The process can further include forming a metal-containing layer over the semiconductor layer, and reacting the metal-containing layer and the semiconductor layer to form a first metal-semiconductor layer. Specific embodiments of the present disclosure will be better understood with reference to FIGS. 1 through 11.

Some terms are defined or clarified as to their intended meaning as they are used within this specification. The term "averaged," when referring to a value, is intended to mean an intermediate value between a high value and a low value. For example, an averaged value can be an average, a geometric mean, or a median.

The term "composition" is intended to indicate a group of elements in a specific ratio of materials. For example a semiconductor composition can be $Si_xGe_y$. $Si_{(x-3)}Ge_{(y+a)}$, where "a" is a value between approximately 0 and approximately "x", would be considered a different semiconductor composition from $Si_xGe_y$. As used herein, subscripts on compound materials specified with alphabetic subscripts are intended to represent the non-zero fraction of the atomic species present in that compound, and therefore, the alphabetic subscripts within a compound sum to 1. For example, in the case of $Si_aGe_bC_c$, the sum of "a," "b," and "c" is 1.

As used herein a "compound semiconductor" is a semiconductor material including two or more different semiconductor elements. $Si_xGe_y$ is an example of a compound semiconductor.

As used herein, the term "lattice constant" of a material is considered to mean the lattice constant measured when the material is at 25 degrees centigrade.

The term "material" is intended to indicate an element or elements within a layer or feature. For example a semiconductor material can be $Si_xGe_y$. $Si_{(x-a)}Ge_{(y+a)}$ would be considered a same semiconductor material as $Si_xGe_y$ while $Si_aGe_bC_c$ would be considered a different semiconductor material. The $Si_aGe_bC_c$ material would "include" the $Si_xGe_y$ material or the $Si_{(x-a)}Ge_{(y+a)}$ material.

The term "semiconductor material" is intended to indicate a semiconductor element or semiconductor elements within a layer or feature. For example, a boron doped $Si_xGe_y$ layer with a concentration of 1E21 atoms per cubic centimeter has the same semiconductor material as an undoped $Si_xGe_y$ layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Figure 1:
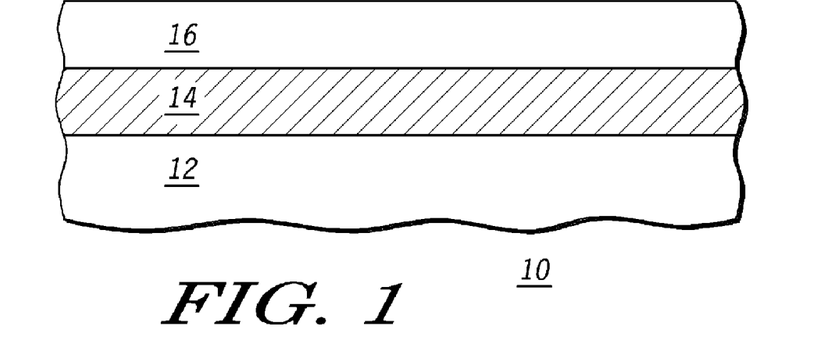
FIG. 1 includes an illustration of a cross-sectional view of a workpiece where an electronic component can subsequently be formed.

FIG. 1 includes an illustration of a cross-sectional view of a portion of a workpiece 10 where an electronic component of an electronic device can subsequently be formed. The workpiece 10 can include a base layer 12, an insulating layer 14, and a semiconductor layer 16. In the illustrated embodiment, the base layer 12 can be a support layer and provide mechanical support for the other layers of the workpiece. For example, the base layer 12 can include an insulating material typically used in manufacturing semiconductor devices such as quartz, glass, plastic, or any combination thereof. In another embodiment, the base layer 12 can include a semiconductor material including a semiconductor element, such as silicon, germanium, carbon, or any combination thereof.

The insulating layer 14 can have a thickness in a range of approximately 5 to approximately 1000 nm. The insulating layer 14 can include an oxide, a nitride, an oxynitride, or any combination thereof. The semiconductor layer 16 can include a semiconductor material such as silicon, germanium, carbon, a compound alloy or any combination thereof and have a substantially uniform thickness in a range of approximately 20 to approximately 1000 nm. The semiconductor layer 16 can be doped with a p-type dopant, an n-type dopant, or any combination thereof. In a particular embodiment, the semiconductor layer 16 can include a silicon germanium layer. Although not illustrated, field isolation regions may also be formed at this time.

Figure 2:
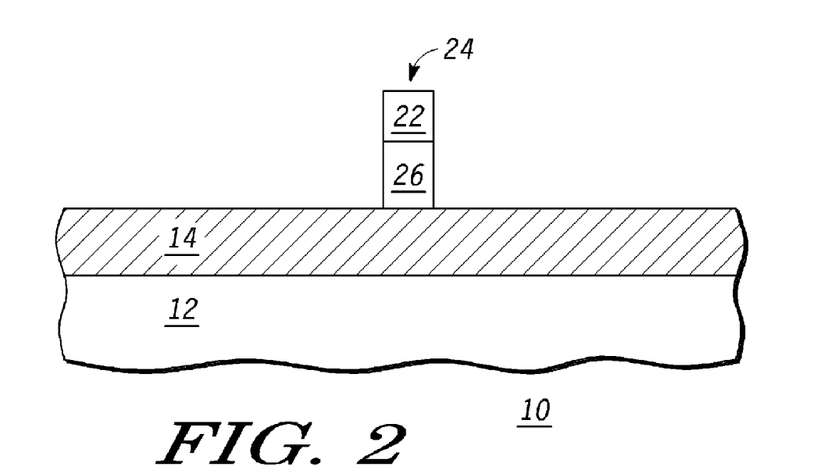
FIG. 2 includes an illustration of a cross-sectional view of the workpiece after formation of a semiconductor fin.

FIG. 2 includes an illustration of a cross-sectional view of the workpiece 10 after forming a semiconductor fin 26 at a location 24 from the semiconductor layer 16. Before forming the semiconductor fin 26, a protective layer 22 can be deposited overlying the semiconductor layer 16 of FIG. 1. The protective layer 22 can be an oxide, a nitride, an oxynitride, another material that is selectively etchable relative to the semiconductor layer 16, or any combination thereof. A conventional or proprietary lithographic and etch process can be used to form a hard mask from the protective layer 22 at location 24. Exposed portions of the semiconductor layer 16 can be removed to form the semiconductor fin 26 at the location 24. The remaining portion of the protective layer 22 can then be removed from the workpiece 10. In one embodiment, the semiconductor fin 26 can be exposed along a top surface and the side surface.

Figure 3:
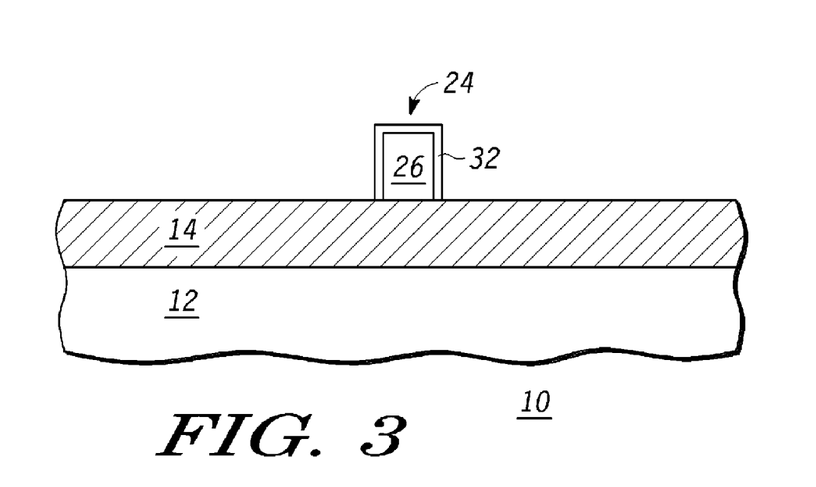
FIG. 3 includes an illustration of a cross-sectional view of the workpiece after formation of a dielectric layer.

FIG. 3 includes an illustration of the workpiece 10 after forming a dielectric layer 32. The dielectric layer 32 can serve as a gate dielectric layer. The dielectric layer 32 can include a film of silicon dioxide, silicon nitride, silicon oxynitride, a high dielectric constant ("high-k") material (e.g., dielectric constant greater than 8), or any combination thereof. The high-k material can include a metal oxide, a metal nitride, a metal oxynitride, a metal semiconductor oxide, a metal semiconductor nitride, a metal semiconductor oxynitride, or any combination thereof. Examples of high-k materials can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. The dielectric layer 32 can have a thickness in a range of approximately 1 to approximately 25 nm. The dielectric layer 32 may be thermally grown using an oxidizing or nitridizing ambient, or deposited using a conventional or proprietary chemical vapor deposition ("CVD") technique, physical vapor deposition ("PVD") technique, or any combination thereof.

Figure 4:
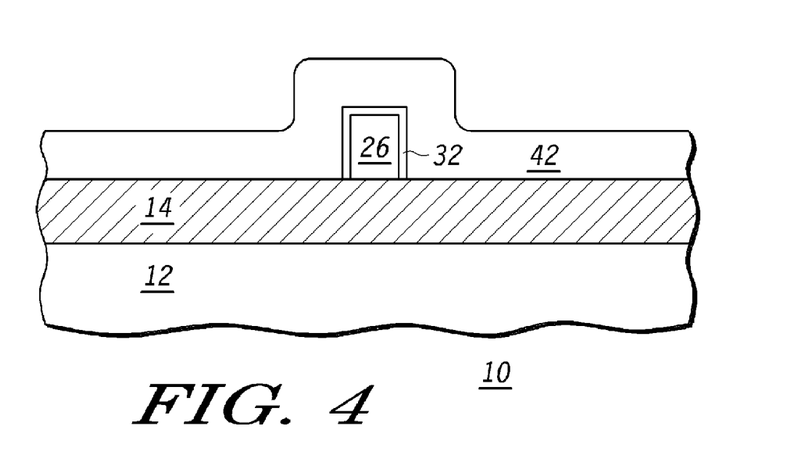
FIG. 4 includes an illustration of a cross-sectional view of the workpiece after formation of a conductive layer suitable for forming a gate electrode.

FIG. 4 includes an illustration of a cross-sectional view of the workpiece 10 after forming a conductive layer 42. The conductive layer 42 can include a semiconductor material suitable for forming a gate electrode for an electronic component at the location 24. The conductive layer 42 can include a conductive material such as silicon, germanium, carbon, a conductive metal-oxide, a conductive metal nitride, a metal-semiconductor material, another suitable gate electrode material, or any combination thereof. In one embodiment, the material of the conductive layer 42 can include platinum, palladium, iridium, osmium, ruthenium, rhenium, indium-tin, indium-zinc, aluminum-tin, or any combination thereof. The conductive layer 42 can have a thickness of between approximately 30 and approximately 200 nm and can be grown or deposited using a conventional or proprietary technique, such as a CVD technique, PVD technique, or any combination thereof. In one embodiment, the conductive layer 42 can include an n-type dopant, such as arsenic or phosphorus. In another embodiment the conductive layer 42 can include a p-type dopant, such as boron.

Figure 5:
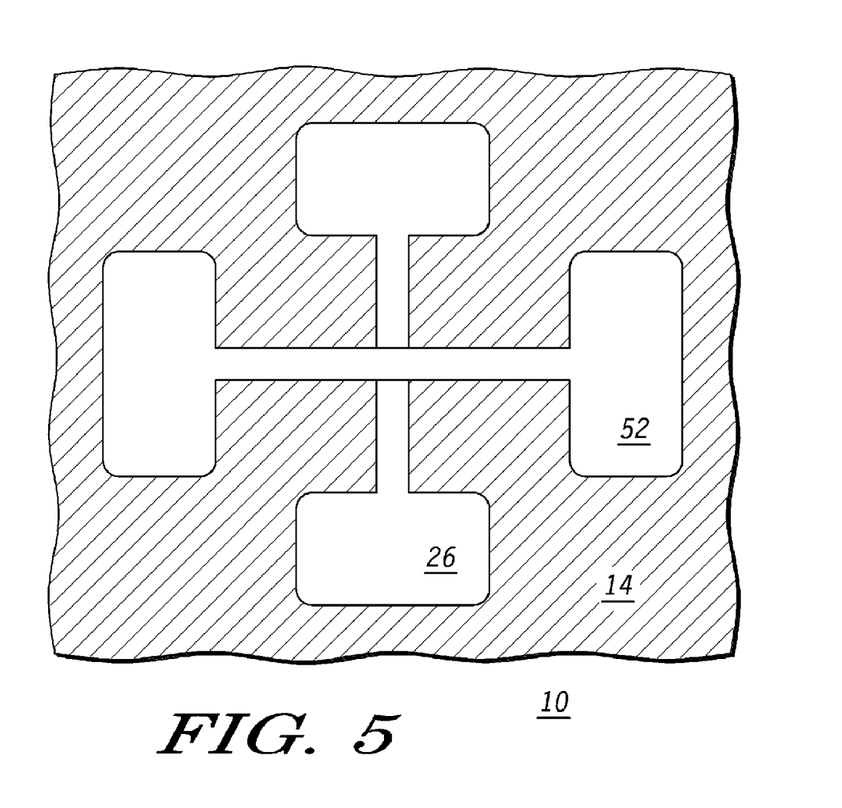
FIG. 5 includes an illustration of a top view of the workpiece after formation of a conductive member.

FIG. 5 includes an illustration of a top view of the workpiece 10 after forming a conductive member 52 from the conductive layer 42. Throughout this specification, some layers are not illustrated in top views to better illustrate the relative positions of other features of the electronic device. For example, in FIG. 5, the dielectric layer 32 over the semiconductor fin 26 is not illustrated. A conventional or proprietary lithographic process is used to form a masking layer (not illustrated) overlying the conductive layer 42. Exposed portions of the conductive layer 42 can then be removed by a conventional or a proprietary etch process. In one embodiment, the etch process can remove the material of the conductive layer 42 and expose portions of the dielectric layer 32 and the insulating layer 14. The masking layer can be removed.

Figure 6:
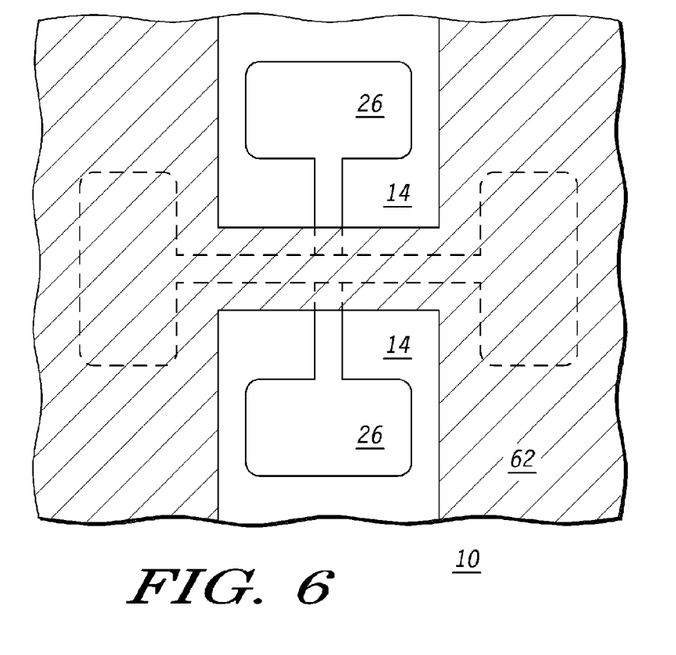
FIG. 6 includes an illustration of a top view of the workpiece after forming openings in an insulating layer.

FIG. 6 includes an illustration of a top view of the workpiece 10 after forming a patterned layer 62. The patterned layer 62 can be formed overlying the workpiece 10. The patterned layer 62 can include an insulating material, and can be formed using any embodiment or material previously described with respect to the protective layer 22. A portion of the insulating layer 14 and the overlying semiconductor fin 26 can be exposed within an opening in the patterned layer 62. In a particular embodiment, the removal process to form the opening can be isotropic in nature such that the wall portions of the semiconductor fin 26 can be exposed. In another embodiment, the removal process to form the opening can lead to a reduction of the dimensions of the exposed features. In one embodiment, sufficient material from the patterned layer 62 is left adjacent to conductive member 52 such that a spacer can subsequently be formed along the conductive member 52.

Figure 7:
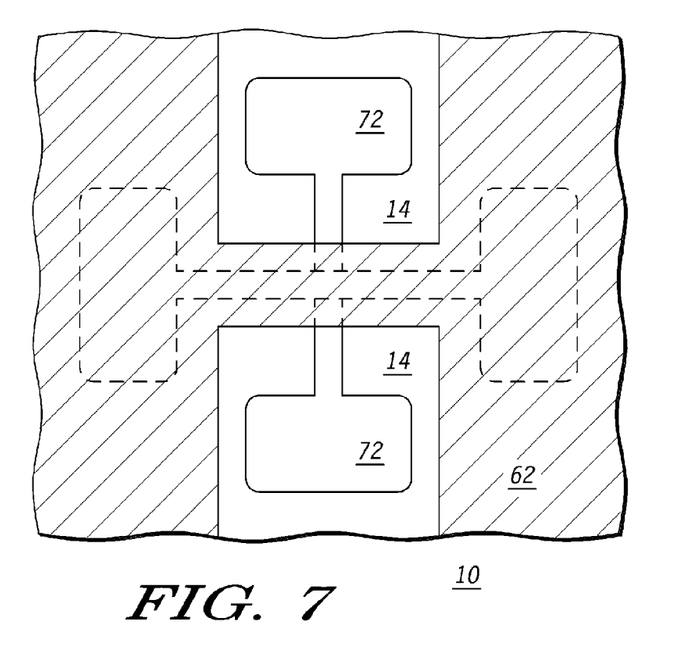
FIG. 7 includes an illustration of a top view of the workpiece after formation of a semiconductor layer over the semiconductor fin.

FIG. 7 includes an illustration of a top view of the workpiece 10 after forming a semiconductor layer 72 overlying the semiconductor fin 26. The semiconductor layer 72 can be grown or deposited by a conventional or proprietary process over the semiconductor fin 26 and can include a semiconductor material previously described for the semiconductor layer 16. In one embodiment, the semiconductor layer 72 is epitaxially grown from an exposed portion of the semiconductor fin 26. In another embodiment, the semiconductor layer 72 can be deposited selectively on the semiconductor fin 26. The semiconductor layer 72 can lie along exposed portions of the semiconductor fin 26, such as a wall surface. In one embodiment the semiconductor layer 72 can abut an exposed surface of the semiconductor fin 26. In the illustrated embodiment, the semiconductor layer 72 can form two portions, each portion spaced-apart from the other, and the conductive member 52 can lie between and be spaced-apart from the two portions. The semiconductor layer 72 can have a thickness in a range of approximately 10 to approximately 50 nm.

In a particular embodiment, a dopant can be introduced during the formation of the semiconductor layer 72 such that both processes can be performed simultaneously at a substantially same point in time. The dopant can be an n-type dopant or a p-type dopant. In a more particular embodiment, the dopant introduction can be started after the growth process is started, the dopant introduction can be stopped before the growth process is completed, or any combination thereof. In another more particular embodiment, the dopant can be boron and have a concentration in a range of approximately 2E20 to approximately 2E21 atoms per cubic centimeter as deposited. In another embodiment, the dopant can be introduced at a different time by an ion implantation process.

The semiconductor layer 72 can include the same semiconductor material or a different semiconductor material as compared to the semiconductor fin 26. In one embodiment, the semiconductor fin 26 and the semiconductor layer 72 can each include a semiconductor comprising a combination of silicon and germanium in a different ratio. In a more particular embodiment, the germanium content of the semiconductor layer 72 can be higher than the germanium content of the semiconductor fin 26. In another embodiment, the semiconductor fin 26 and the semiconductor layer 72 have different lattice constants.

Although not illustrated, a dopant drive process can be performed such that the dopant in the semiconductor layer 72 can diffuse or otherwise migrate from the semiconductor layer 72 to the semiconductor fin 26. The dopant drive process can be performed by a conventional or proprietary. In one embodiment, the process can be performed in a rapid thermal annealing apparatus. In another embodiment, the process can be performed in a conventional furnace. In one embodiment, driving the dopant forms a first and a second source/drain region that can be spaced-apart from each other. After the dopant drive, a dopant concentration within the semiconductor layer 72 may be higher than a dopant concentration within the semiconductor fin 26 of the first and the second source drain regions.

Figure 8:
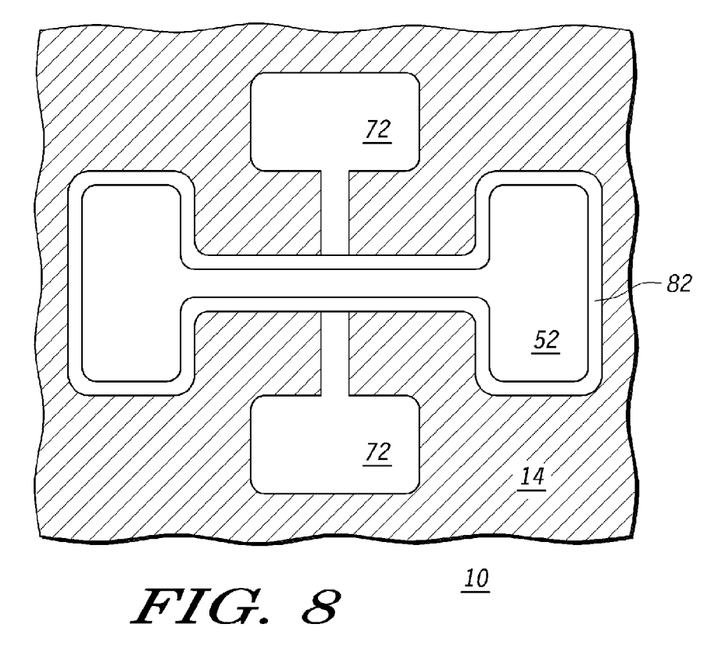
FIG. 8 includes an illustration of a top view of the workpiece after formation of a spacer structure along the conductive member.

FIG. 8 includes an illustration of a top view of the workpiece 10 after forming a spacer structure 82 adjacent to conductive member 52. A conventional or proprietary etch process can be performed to remove a portion of patterned layer 62 to form a spacer structure 82 along the sidewalls of the conductive member 52. In a particular embodiment, the etch process can be selective with respect to the material of the semiconductor layer 72, the conductive member 52, the semiconductor fin 26, the insulating layer 14, or any combination thereof.

Figure 9:
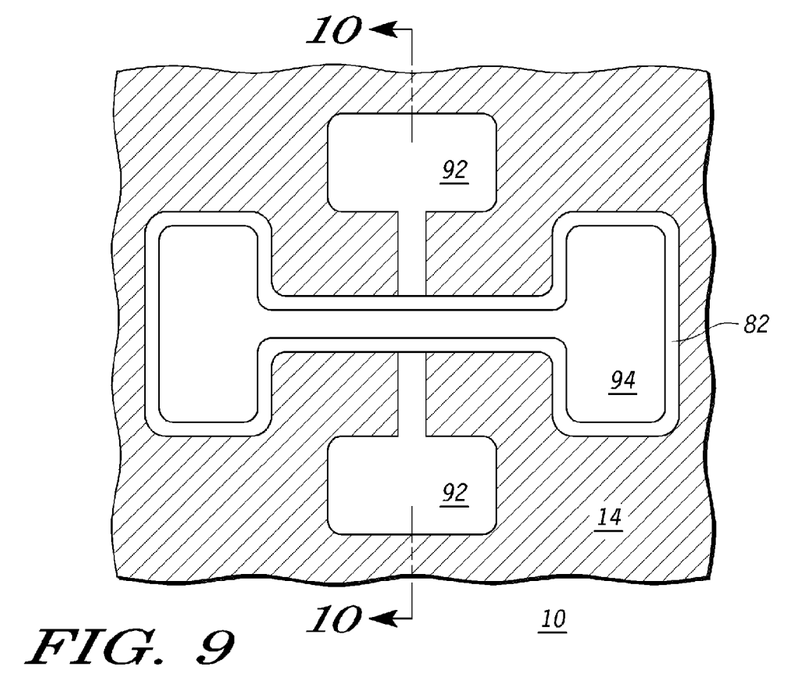
FIG. 9 includes an illustration of a top view of the workpiece after formation of a metal-semiconductor layer over the workpiece.
Figure 10:
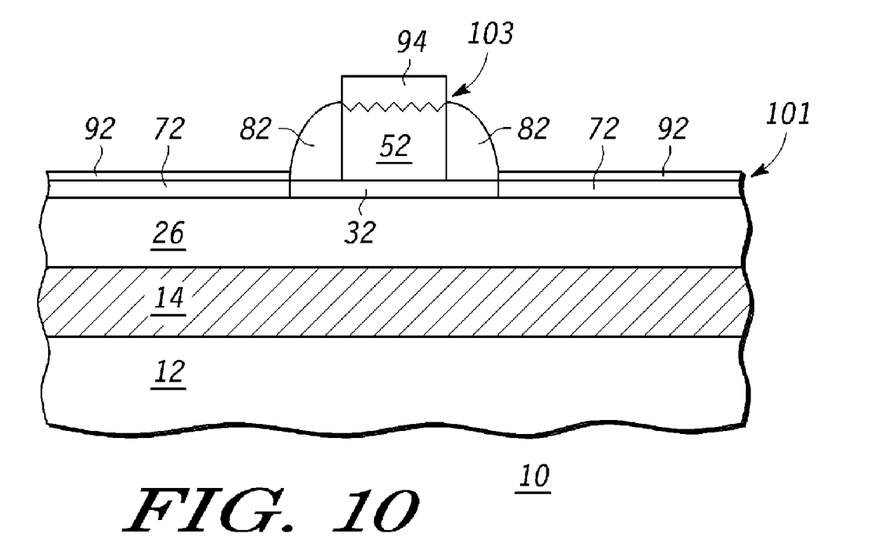
FIG. 10 includes an illustration of a cross-sectional view of the workpiece of FIG. 9

FIGS. 9 and 10 include a top and a cross-sectional view, respectively, of the workpiece 10 after forming a metal-semiconductor layer 92 with an interface 101. Before forming the metal-semiconductor layer 92, a metal layer (not illustrated) can be formed over the workpiece 10 using a conventional or proprietary CVD, PVD, or any combination thereof, technique. The metal layer can include titanium, tungsten, nickel, cobalt, erbium, platinum or any combination thereof and can have a thickness in a range of approximately 2 to approximately 20 nm. In one embodiment, the metal layer can be selectively deposited on the semiconductor layer 72. In another embodiment, the metal layer can be deposited as a blanket layer substantially covering the workpiece 10. A portion of the underlying semiconductor material can react with the metal layer to form a metal-semiconductor layer 92 with an interface 101. In one embodiment, the metal layer can also be formed over and react with the semiconductor material of the conductive member 52 to form a metal-semiconductor layer 94 with an interface 103. In one embodiment, unreacted metal, if any, can be removed from the workpiece 10. In a particular embodiment the metal removal is selective to the metal-semiconductor material, the exposed insulating material, or any combination thereof.

In the formation of metal-semiconductor material, semiconductor material from an underlying layer can be consumed. Thus, the interface 101 can be formed between the metal-semiconductor layer 92 and the underlying semiconductor material of the semiconductor layer 72, and the interface 103 can be formed between the metal-semiconductor layer 94 and the underlying semiconductor material of the conductive layer 42. The interface roughness can be affected by the composition of the metal layer and the composition of the semiconductor material consumed. Thus, the interface 101 and 103 can each have a roughness different than the other. In one embodiment, the interface 101 can be smoother than the interface 103. In a particular embodiment, the interface 101 can have an Ra value not more than approximately 2 nm when the interface 103 has an Ra value greater than approximately 2 nm. In another embodiment, the metal-semiconductor layer 92 can be more uniform in thickness than the metal-semiconductor layer 94. In a particular embodiment, the metal-semiconductor layer 92 can have a substantially uniform thickness, wherein the thickness variation in the metal-semiconductor layer 92 can be less than half of the thickness variation in the metal-semiconductor layer 94.

Figure 11:
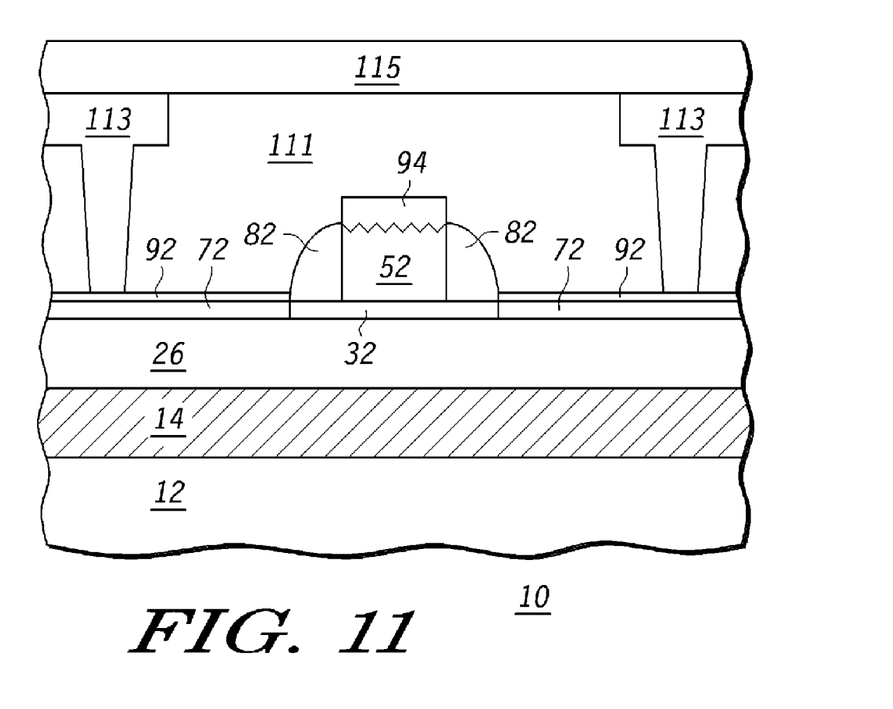
FIG. 11 includes an illustration of a cross-sectional view of a substantially completed electronic device.

FIG. 11 includes an illustration of a cross-sectional view of a substantially completed electronic device. One or more insulating layers 111, one or more conductive layers 113, and one or more encapsulating layers 115 are formed using one or more conventional or proprietary techniques.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include an insulating layer, and a semiconductor fin overlying the insulating layer. The electronic device can also include a semiconductor layer overlying the semiconductor fin, wherein the semiconductor layer has a first portion and a second portion that are spaced-apart from each other. The electronic device can further include a conductive member lying between and spaced-apart from the first portion of the semiconductor layer and the second portion of the semiconductor layer, and overlying and spaced-apart from the semiconductor fin. The electronic device can still further include a metal-semiconductor layer overlying the semiconductor layer.

In one embodiment of the first aspect, the electronic device can include the metal-semiconductor layer having a substantially uniform thickness. In another embodiment, the semiconductor fin and the semiconductor layer each including silicon, carbon, germanium, a compound alloy or any combination thereof. Further, the metal-semiconductor layer includes nickel, tungsten, titanium, cobalt, erbium, platinum, or any combination thereof. In a particular embodiment, the semiconductor fin and the semiconductor layer include a same semiconductor material. Further, the semiconductor fin has a first semiconductor composition, and the semiconductor layer has a second semiconductor composition different from the first semiconductor composition.

In a more particular embodiment of the first aspect, the first semiconductor composition includes a first ratio of silicon:germanium, and the second semiconductor composition includes a second ratio of silicon:germanium, wherein the second ratio is different from the first ratio. In another embodiment of the first aspect, an averaged concentration of a dopant in the semiconductor layer is higher than an averaged concentration of the dopant in the semiconductor fin. In still another embodiment, the semiconductor fin and the semiconductor layer have different lattice constants.

In another embodiment of the first aspect, the electronic device can include a transistor. The transistor can include the conductive member, wherein the conductive member includes gate electrode portions that lie adjacent to opposing sides of the first semiconductor fin. The transistor can also include a first source/drain region, and a second source/drain region spaced-apart from the first source/drain region. The transistor can further include a channel region lying within the semiconductor fin and between the first source/drain region and the second source/drain region, wherein the channel region is configured, such that when the transistor would be on, charge carriers would flow through the channel region in a direction substantially parallel to a primary surface of the insulating layer.

In a second aspect, an electronic device can include an insulating layer, and a semiconductor fin overlying the insulating layer. The electronic device can also include a semiconductor layer abutting the semiconductor fin, wherein the semiconductor layer includes a dopant, and the semiconductor layer has a first portion and a second portion that are spaced-apart from each other. The electronic device can further include a conductive member lying between and spaced-apart from the first portion of the semiconductor layer and the second portion of the semiconductor layer, and overlying and spaced-apart from the semiconductor fin.

In one embodiment of the second aspect, the semiconductor layer includes a compound semiconductor can include silicon, carbon, germanium, or any combination thereof. In another embodiment of the second aspect, can further include a metal-semiconductor layer overlying the semiconductor layer. In yet another embodiment, the electronic device includes a transistor. The transistor can include a gate electrode including gate electrode portions of the conductive member that lie adjacent to opposing sides of the first semiconductor fin. The transistor can also include a first source/drain region, and a second source/drain region spaced-apart from the first source/drain region. The transistor can also include a channel region lying within the semiconductor fin and between the first source/drain region and the second source/drain region, wherein the channel region is configured, such that when the transistor would be on, charge carriers would flow through the channel region in a direction substantially parallel to a primary surface of the insulating layer.

In a third aspect, a process of forming an electronic device can include forming a semiconductor fin over an insulating layer, wherein the semiconductor fin includes a wall surface and has a first germanium content. The process can also include forming a semiconductor layer abutting the wall surface of the semiconductor fin, wherein the semiconductor layer includes a dopant and has a second germanium content higher than the first germanium content, and wherein the dopant is an n-type dopant or a p-type dopant. The process can further include forming a metal-containing layer over the semiconductor layer, and reacting the metal-containing layer and the semiconductor layer to form a first metal-semiconductor layer.

In one embodiment of the third aspect, forming the semiconductor layer includes epitaxially growing the semiconductor layer and introducing the dopant that are performed simultaneously at substantially a same point in time. In another embodiment, the process further includes forming a conductive member over and spaced-apart from the semiconductor fin. Forming a metal-containing layer comprises forming the metal-containing layer over the conductive member, and reacting the metal-containing layer comprises reacting the metal-containing layer and the conductive member, wherein the metal-containing layer and the semiconductor layer react to form a first metal-semiconductor layer having a first interface along a bottom surface of the first metal-semiconductor layer, wherein the first interface is characterized by a first roughness, and the metal-containing layer and the conductive member react to form a second metal-semiconductor layer having a second interface along a bottom surface of the second metal-semiconductor layer, wherein the second interface is characterized by a second roughness that is greater than the first roughness.

In a further embodiment of the third aspect, the process further includes driving a portion of the dopant from the semiconductor layer to the semiconductor fin. In a particular embodiment, the process further includes forming a conductive member over the semiconductor fin, wherein forming the conductive member is performed before forming the semiconductor layer. In a more particular embodiment, driving the dopant forms a first source/drain region and a second source/drain region spaced-apart from the first source/drain region. A channel region lies within the semiconductor fin, and the channel region is configured, such that when a transistor including the channel region would be on, charge carriers would flow through the channel region in a direction substantially parallel to a primary surface of the insulating layer. Forming the conductive member includes forming a gate electrode having portions that lie adjacent to opposing sides of the semiconductor fin.

In an even more particular embodiment of the third aspect, forming the semiconductor layer is performed such that substantially none of the semiconductor layer lies between the channel region and the conductive member. In a yet even more particular embodiment, forming the semiconductor layer includes selectively depositing or epitaxially growing the semiconductor layer along exposed portions of the semiconductor fin. In a highly particular, non-limiting embodiment, forming the semiconductor layer is performed such that a concentration of the dopant within the semiconductor layer, as formed, is in a range of approximately 2E20 to 2E21 atoms per cubic centimeter.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
   an insulating layer;
   a semiconductor fin overlying the insulating layer;
   a semiconductor layer overlying the semiconductor fin, wherein the semiconductor layer has a first portion and a second portion that are spaced-apart from each other;
   a conductive member lying between and spaced-apart from the first portion of the semiconductor layer and the second portion of the semiconductor layer, and overlying and spaced-apart from the semiconductor fin; and
   a metal-semiconductor layer overlying the semiconductor layer,
   wherein:
      a first interface lies between the semiconductor layer and the metal-semiconductor layer;
      the conductive member includes a semiconductor portion, a metal-semiconductor portion, and a second interface therebetween; and
      the first interface has a first surface roughness value, and the second interface has a second surface roughness value that is greater than the first surface roughness value.

2. The electronic device of claim 1, wherein the metal-semiconductor layer has a substantially uniform thickness.

3. The electronic device of claim 1, wherein:
   the semiconductor fin and the semiconductor layer each comprise silicon, carbon, germanium, a compound alloy or any combination thereof; and
   the metal-semiconductor layer comprises nickel, tungsten, titanium, cobalt, erbium, platinum, or any combination thereof.

4. The electronic device of claim 3, wherein:
   the semiconductor fin and the semiconductor layer comprise a same semiconductor material;
   the semiconductor fin has a first semiconductor composition; and
   the semiconductor layer has a second semiconductor composition different from the first semiconductor composition.

5. The electronic device of claim 4, wherein:
   the first semiconductor composition includes a first ratio of silicon:germanium; and
   the second semiconductor composition includes a second ratio of silicon:germanium, wherein the second ratio is different from the first ratio.

6. The electronic device of claim 1, wherein an averaged concentration of a dopant in the semiconductor layer is higher than an averaged concentration of the dopant in the semiconductor fin.

7. The electronic device of claim 1, wherein the semiconductor fin and the semiconductor layer have different lattice constants.

8. The electronic device of claim 1, wherein the electronic device comprises a transistor including:
   the conductive member, wherein the conductive member includes gate electrode portions that lie adjacent to opposing sides of the semiconductor fin;
   a first source/drain region;
   a second source/drain region spaced-apart from the first source/drain region; and
   a channel region lying within the semiconductor fin and between the first source/drain region and the second source/drain region, wherein the channel region is configured, such that when the transistor would be on, charge carriers would flow through the channel region in a direction substantially parallel to a primary surface of the insulating layer.

9. The electronic device of claim 8, wherein the transistor further comprises a gate dielectric layer having a dielectric constant greater than 8.

10. The electronic device of claim 8, wherein the channel region does not include the semiconductor layer.

11. The electronic device of claim 1, wherein the semiconductor layer comprises a silicon germanium layer.

12. The electronic device of claim 1, wherein the first surface roughness value is not more than approximately 2 nm.

13. The electronic device of claim 1, wherein the second surface roughness value is greater than approximately 2 nm.

14. An electronic device comprising:
   an insulating layer;
   a semiconductor fin overlying the insulating layer;
   a semiconductor layer abutting the semiconductor fin, wherein the semiconductor layer includes a dopant and has a first portion and a second portion that are spaced-apart from each other; and
   a conductive member lying between and spaced-apart from the first portion of the semiconductor layer and the second portion of the semiconductor layer, and overlying and spaced-apart from the semiconductor fin,
   wherein the electronic device includes a transistor that comprises a first source/drain region, a second source/drain region, and a channel region, wherein:
      the first source/drain region includes a first portion of the semiconductor layer;
      the second source/drain region is spaced apart from the first source/drain region and includes a second portion of the semiconductor layer; and
      the channel region does not include the semiconductor layer.

15. The electronic device of claim 14, further including a metal-semiconductor layer overlying the semiconductor layer.

16. The electronic device of claim 14, wherein the transistor further comprises a gate electrode, wherein:
   the gate electrode includes gate electrode portions of the conductive member that lie adjacent to opposing sides of the semiconductor fin; and
   the channel region lies within the semiconductor fin and between the first source/drain region and the second source/drain region, wherein the channel region is configured, such that when the transistor would be on, charge carriers would flow through the channel region in a direction substantially parallel to a primary surface of the insulating layer.

17. The electronic device of claim 14, wherein:
   the semiconductor fin includes a wall surface and has a first germanium content;
   the semiconductor layer has a second germanium content higher than the first germanium content.

18. The electronic device of claim 14, further comprising a metal-semiconductor layer overlying the semiconductor fin, wherein:
   a first interface lies between the semiconductor layer and the metal-semiconductor layer; and
   the conductive member includes a semiconductor portion, a metal-semiconductor portion, and a second interface therebetween.

19. The electronic device of claim 14, wherein the transistor further comprises a gate dielectric layer having a dielectric constant greater than 8.

20. The electronic device of claim 14, wherein the semiconductor layer comprises a silicon germanium layer.

* * * * *